United States Patent
Li et al.

(10) Patent No.: US 9,967,890 B2
(45) Date of Patent: May 8, 2018

(54) SIGNALLING FOR FRACTIONAL FREQUENCY REUSE (FFR) FOR D2D COMMUNICATIONS

(71) Applicant: QUALCOMM Incorporated, San Diego, CA (US)

(72) Inventors: Qiao Li, Hillsborough, NJ (US); Saurabha Rangrao Tavildar, Jersey City, NJ (US); Bilal Sadiq, Basking Ridge, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 14/191,334

(22) Filed: Feb. 26, 2014

(65) Prior Publication Data

US 2015/0245362 A1    Aug. 27, 2015

(51) Int. Cl.
| | |
|---|---|
| *H04W 4/00* | (2018.01) |
| *H04W 72/08* | (2009.01) |
| *G06F 17/50* | (2006.01) |
| *H01L 27/02* | (2006.01) |
| *H04W 72/04* | (2009.01) |
| *H01L 27/092* | (2006.01) |

(52) U.S. Cl.
CPC ...... *H04W 72/082* (2013.01); *G06F 17/5072* (2013.01); *H01L 27/0207* (2013.01); *H04W 72/0453* (2013.01); *H01L 27/092* (2013.01)

(58) Field of Classification Search
CPC ............ H04W 72/082; H04W 72/0453; G06F 17/5072; H01L 27/0207; H04L 27/092
USPC .......... 370/329–334, 341; 455/450, 464, 509
See application file for complete search history.

(56) References Cited

U.S. PATENT DOCUMENTS

| | | | |
|---|---|---|---|
| 2011/0205929 A1* | 8/2011 | Quek .................... | H04W 16/30 370/252 |
| 2012/0282934 A1* | 11/2012 | Simonsson ........... | H04W 72/12 455/446 |
| 2013/0308551 A1* | 11/2013 | Madan .............. | H04W 72/0406 370/329 |

(Continued)

FOREIGN PATENT DOCUMENTS

| | | | | |
|---|---|---|---|---|
| WO | 2013134891 A1 | 9/2013 | | |
| WO | WO 2013134891 A1 * | 9/2013 | ............. | H04L 5/005 |

(Continued)

OTHER PUBLICATIONS conniq.com, "Fractional Frequency Reuse in mobile WiMAX", XP002740114, Jan. 1, 2012, 2 Pages. Retrieved from the Internet: URL:http://www.conniq.com/WiMAX/fractional-frequency-reuse.htm [retrieved on May 26, 2015].

(Continued)

*Primary Examiner* — Mang Yeung
(74) *Attorney, Agent, or Firm* — Arent Fox, LLP

(57) ABSTRACT

A method, an apparatus, and a computer program product for wireless communication are provided. The apparatus determines a subset of subchannels for a first cell, the subset of subchannels configured to reduce interference to at least a second UE in a second cell, determines whether a first UE in the first cell is interfering with a second UE in a second cell, and allocates at least one subchannel to the first UE from the subset of subchannels when the first UE in the first cell is interfering with the second UE in the second cell.

27 Claims, 16 Drawing Sheets

(56) References Cited

U.S. PATENT DOCUMENTS

2014/0038653 A1* 2/2014 Mildh ................. H04W 28/048
                                                      455/501
2015/0156783 A1* 6/2015 Klang ................. H04W 72/082
                                                      455/436

FOREIGN PATENT DOCUMENTS

WO         2013176592 A1    11/2013
WO    WO 2013176592 A1 *    11/2013   .......... H04W 72/082

OTHER PUBLICATIONS

International Search Report and Written Opinion—PCT/US2015/017272—ISA/EPO—Jun. 8, 2015.

* cited by examiner

SIGNALLING FOR FRACTIONAL FREQUENCY REUSE (FFR) FOR D2D COMMUNICATIONS

BACKGROUND

Field

The present disclosure relates generally to communication systems, and more particularly, to signaling for FFR for device-to-device (D2D) communications.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). LTE is designed to better support mobile broadband Internet access by improving spectral efficiency, lowering costs, improving services, making use of new spectrum, and better integrating with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

SUMMARY

In an aspect of the disclosure, a method, a computer program product, and an apparatus are provided. The apparatus (e.g., eNB 808) determines a subset of subchannels for a first cell, the subset of subchannels configured to reduce interference to at least a second UE in a second cell, determines whether a first user equipment (UE) in the first cell is interfering with a second UE in a second cell, and allocates at least one subchannel to the first UE from the subset of subchannels when the first UE in the first cell is interfering with the second UE in the second cell.

In an aspect of the disclosure, a method, a computer program product, and an apparatus are provided. The apparatus may be a first UE (e.g., first UE 814). The first UE determines whether the first UE in a first cell is interfering with a second UE in a second cell and receives an allocation of at least one subchannel from a subset of subchannels for the first cell when the first UE in the first cell is interfering with the second UE in the second cell, the subset of subchannels being configured to reduce interference to at least the second UE in the second cell.

DETAILED DESCRIPTION

Figure 1:
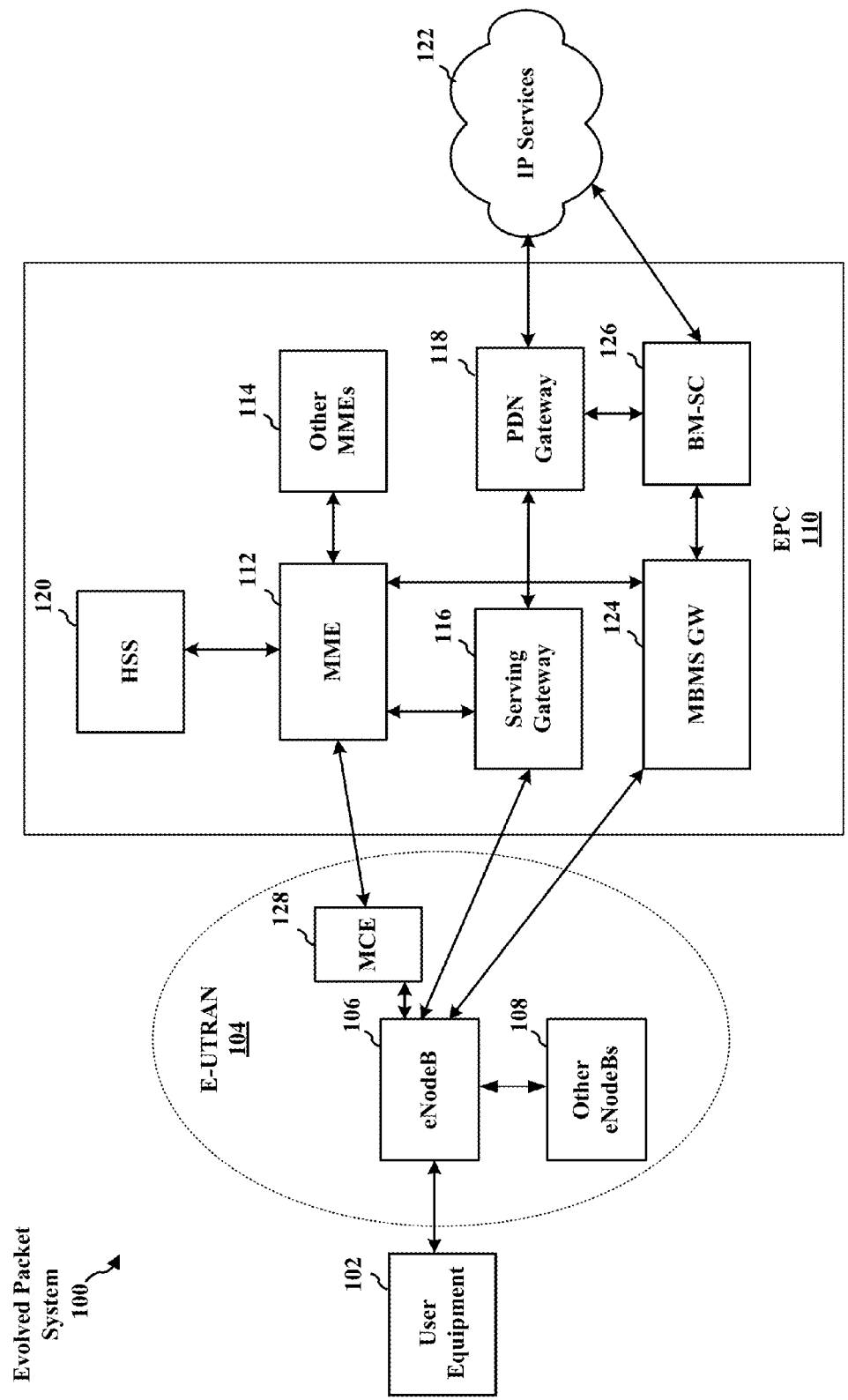
FIG. 1 is a diagram illustrating an example of a network architecture.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, or any other medium that can be used to carry or store desired program code in the form of instructions or data structures and that can be accessed by a computer. Combinations of the above should also be included within the scope of computer-readable media.

FIG. 1 is a diagram illustrating an LTE network architecture 100. The LTE network architecture 100 may be referred to as an Evolved Packet System (EPS) 100. The EPS 100 may include one or more user equipment (UE) 102, an Evolved UMTS Terrestrial Radio Access Network (E-UTRAN) 104, an Evolved Packet Core (EPC) 110, and an Operator's Internet Protocol (IP) Services 122. The EPS can interconnect with other access networks, but for simplicity those entities/interfaces are not shown. As shown, the EPS provides packet-switched services, however, as those skilled in the art will readily appreciate, the various concepts presented throughout this disclosure may be extended to networks providing circuit-switched services.

The E-UTRAN includes the evolved Node B (eNB) 106 and other eNBs 108, and may include a Multicast Coordination Entity (MCE) 128. The eNB 106 provides user and control planes protocol terminations toward the UE 102. The eNB 106 may be connected to the other eNBs 108 via a backhaul (e.g., an X2 interface). The MCE 128 allocates time/frequency radio resources for evolved Multimedia Broadcast Multicast Service (MBMS) (eMBMS), and determines the radio configuration (e.g., a modulation and coding scheme (MCS)) for the eMBMS. The MCE 128 may be a separate entity or part of the eNB 106. The eNB 106 may also be referred to as a base station, a Node B, an access point, a base transceiver station, a radio base station, a radio transceiver, a transceiver function, a basic service set (BSS), an extended service set (ESS), or some other suitable terminology. The eNB 106 provides an access point to the EPC 110 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, or any other similar functioning device. The UE 102 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNB 106 is connected to the EPC 110. The EPC 110 may include a Mobility Management Entity (MME) 112, a Home Subscriber Server (HSS) 120, other MMEs 114, a Serving Gateway 116, a Multimedia Broadcast Multicast Service (MBMS) Gateway 124, a Broadcast Multicast Service Center (BM-SC) 126, and a Packet Data Network (PDN) Gateway 118. The MME 112 is the control node that processes the signaling between the UE 102 and the EPC 110. Generally, the MME 112 provides bearer and connection management. All user IP packets are transferred through the Serving Gateway 116, which itself is connected to the PDN Gateway 118. The PDN Gateway 118 provides UE IP address allocation as well as other functions. The PDN Gateway 118 and the BM-SC 126 are connected to the IP Services 122. The IP Services 122 may include the Internet, an intranet, an IP Multimedia Subsystem (IMS), a PS Streaming Service (PSS), and/or other IP services. The BM-SC 126 may provide functions for MBMS user service provisioning and delivery. The BM-SC 126 may serve as an entry point for content provider MBMS transmission, may be used to authorize and initiate MBMS Bearer Services within a PLMN, and may be used to schedule and deliver MBMS transmissions. The MBMS Gateway 124 may be used to distribute MBMS traffic to the eNBs (e.g., 106, 108) belonging to a Multicast Broadcast Single Frequency Network (MBSFN) area broadcasting a particular service, and may be responsible for session management (start/stop) and for collecting eMBMS related charging information.

Figure 2:
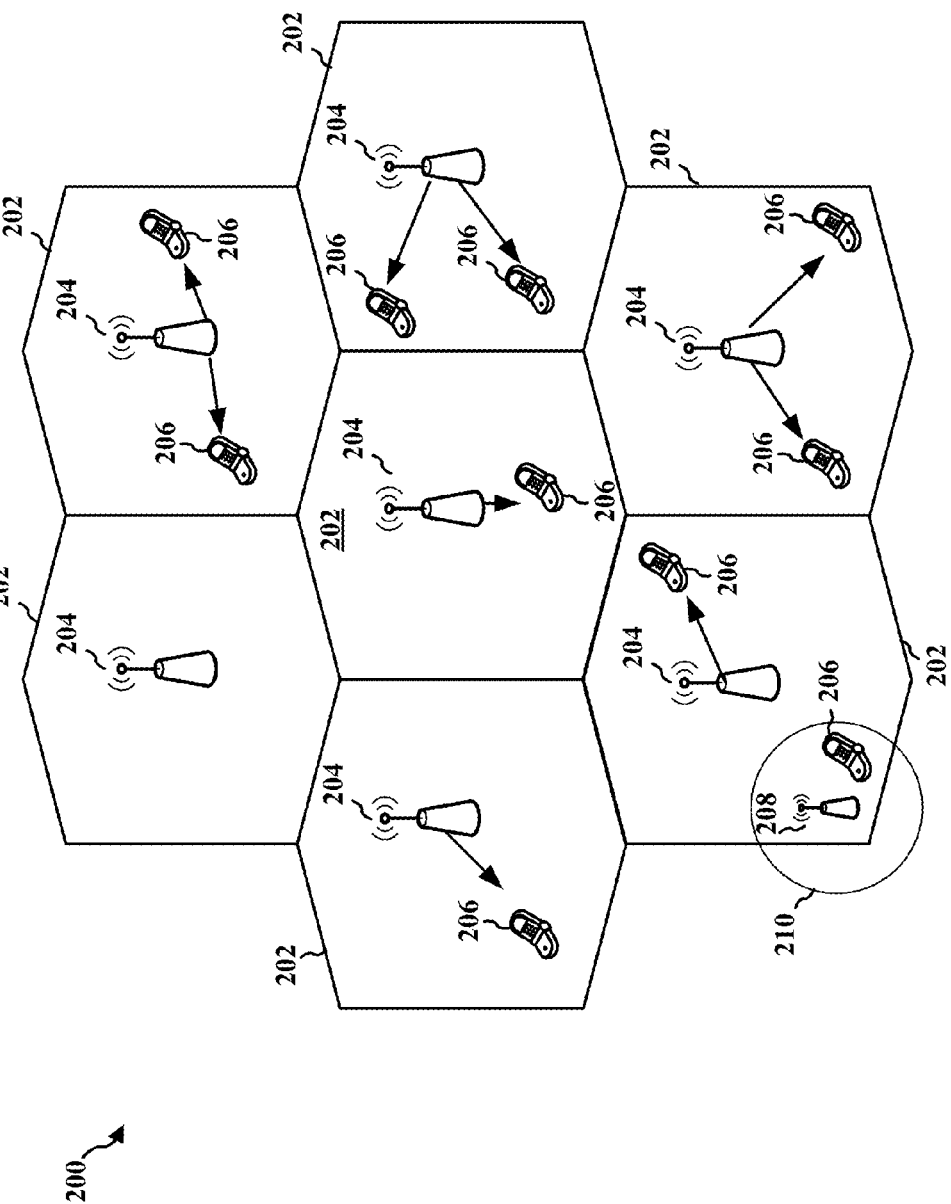
FIG. 2 is a diagram illustrating an example of an access network.

FIG. 2 is a diagram illustrating an example of an access network 200 in an LTE network architecture. In this example, the access network 200 is divided into a number of cellular regions (cells) 202. One or more lower power class eNBs 208 may have cellular regions 210 that overlap with one or more of the cells 202. The lower power class eNB 208 may be a femto cell (e.g., home eNB (HeNB)), pico cell, micro cell, or remote radio head (RRH). The macro eNBs 204 are each assigned to a respective cell 202 and are configured to provide an access point to the EPC 110 for all the UEs 206 in the cells 202. There is no centralized controller in this example of an access network 200, but a centralized controller may be used in alternative configurations. The eNBs 204 are responsible for all radio related functions including radio bearer control, admission control, mobility control, scheduling, security, and connectivity to the serving gateway 116. An eNB may support one or multiple (e.g., three) cells (also referred to as a sectors). The term "cell" can refer to the smallest coverage area of an eNB and/or an eNB subsystem serving are particular coverage area. Further, the terms "eNB," "base station," and "cell" may be used interchangeably herein.

The modulation and multiple access scheme employed by the access network 200 may vary depending on the particular telecommunications standard being deployed. In LTE applications, OFDM is used on the DL and SC-FDMA is used on the UL to support both frequency division duplex (FDD) and time division duplex (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data streams may be transmitted to a single UE 206 to increase the data rate or to multiple UEs 206 to increase the overall system capacity. This is achieved by spatially precoding each data stream (i.e., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
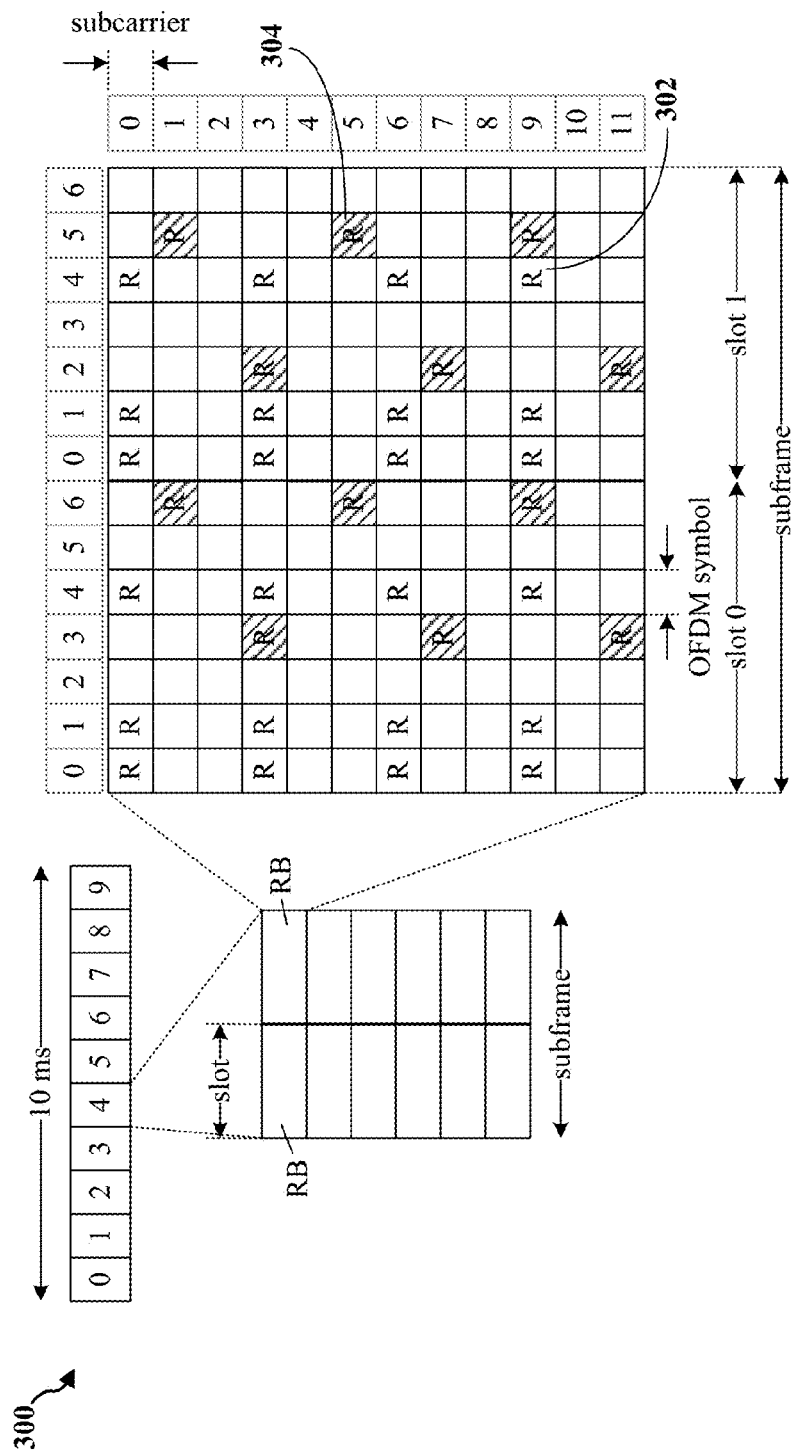
FIG. 3 is a diagram illustrating an example of a DL frame structure in LTE.

FIG. 3 is a diagram 300 illustrating an example of a DL frame structure in LTE. A frame (10 ms) may be divided into 10 equally sized subframes. Each subframe may include two consecutive time slots. A resource grid may be used to represent two time slots, each time slot including a resource block. The resource grid is divided into multiple resource elements. In LTE, for a normal cyclic prefix, a resource block contains 12 consecutive subcarriers in the frequency domain and 7 consecutive OFDM symbols in the time domain, for a total of 84 resource elements. For an extended cyclic prefix, a resource block contains 12 consecutive subcarriers in the frequency domain and 6 consecutive OFDM symbols in the time domain, for a total of 72 resource elements. Some of the resource elements, indicated as R 302, 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

Figure 4:
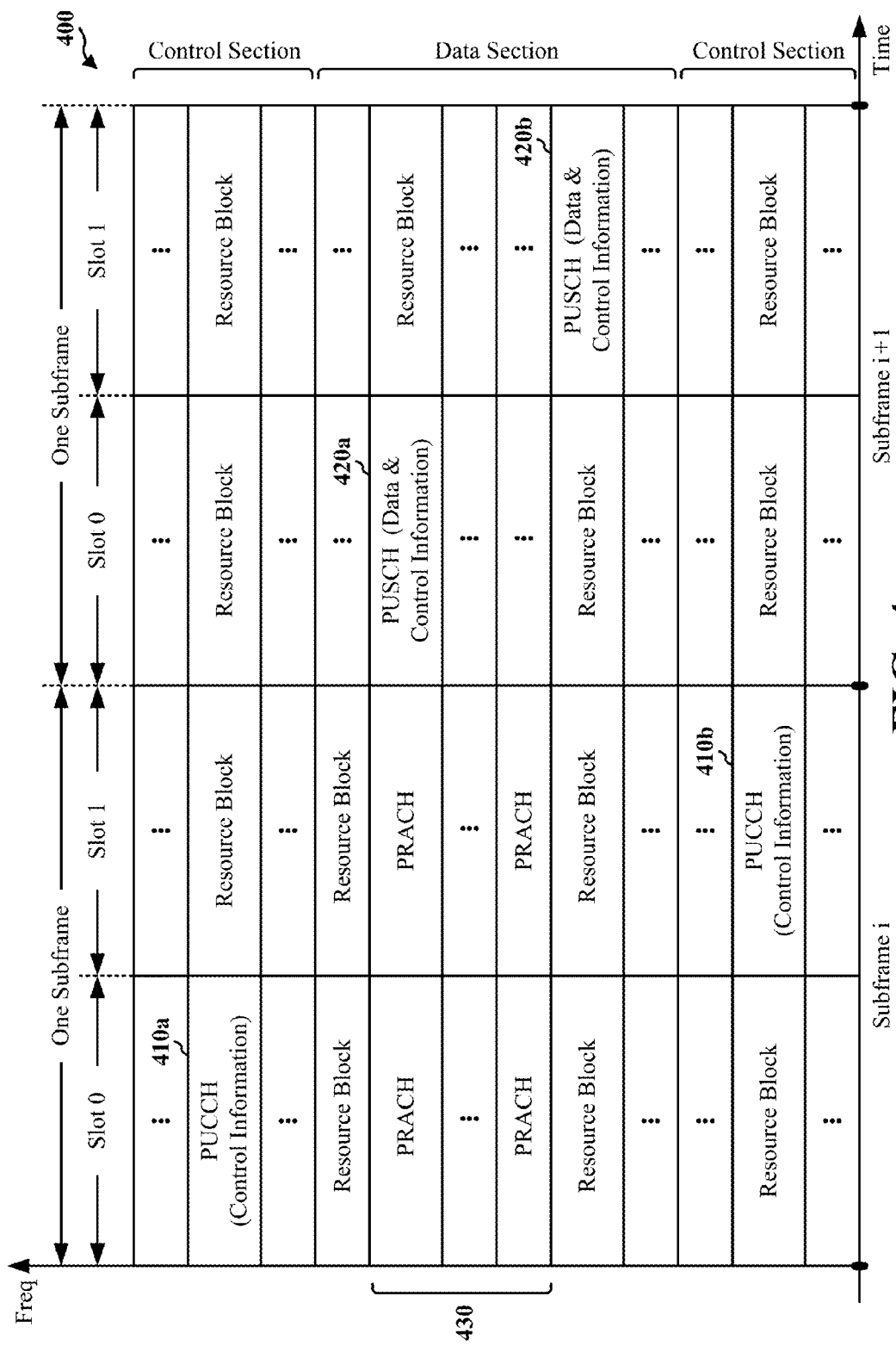
FIG. 4 is a diagram illustrating an example of an UL frame structure in LTE.

FIG. 4 is a diagram 400 illustrating an example of an UL frame structure in LTE. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410*a*, 410*b* in the control section to transmit control information to an eNB. The UE may also be assigned resource blocks 420*a*, 420*b* in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
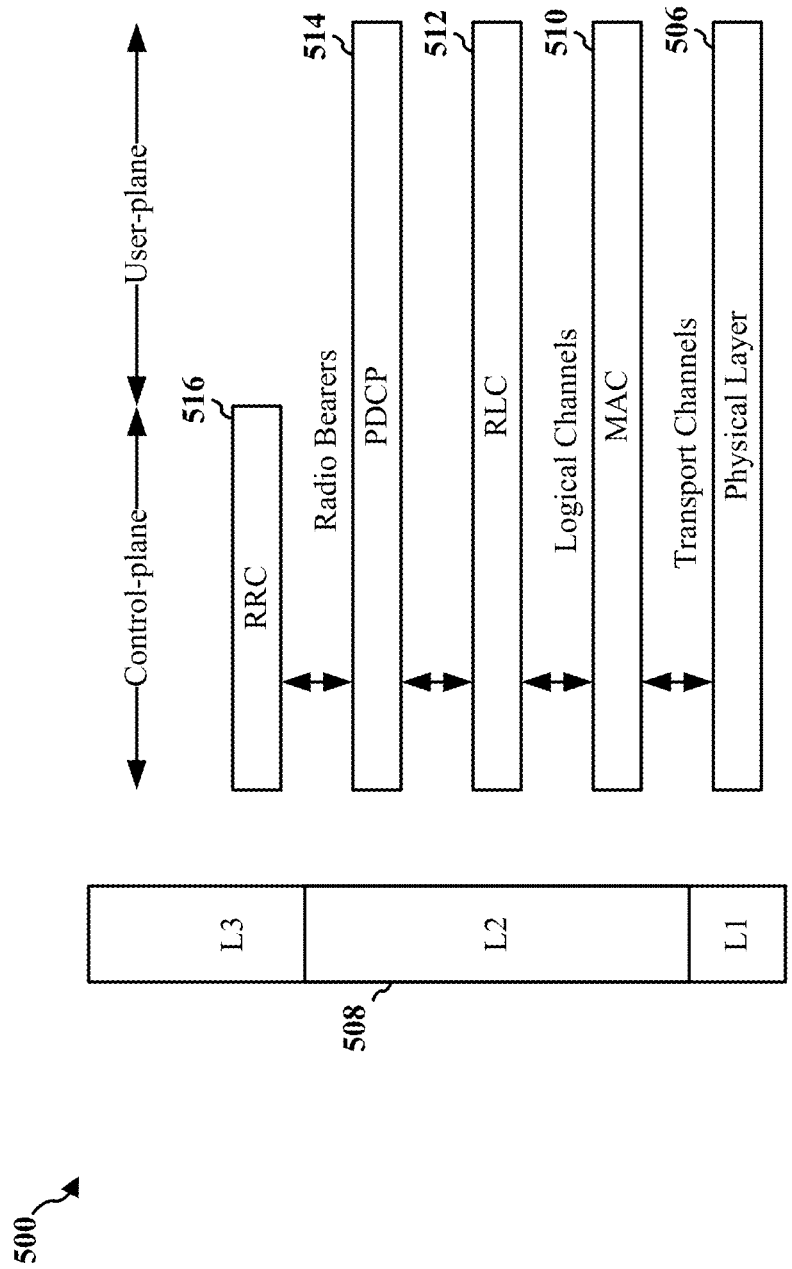
FIG. 5 is a diagram illustrating an example of a radio protocol architecture for the user and control planes.

FIG. 5 is a diagram 500 illustrating an example of a radio protocol architecture for the user and control planes in LTE. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and eNB is substantially the same for the physical layer 506 and the L2 layer 508 with the exception that there is no header compression function for the control plane. The control plane also includes a radio resource control (RRC) sublayer 516 in Layer 3 (L3 layer). The RRC sublayer 516 is responsible for obtaining radio resources (e.g., radio bearers) and for configuring the lower layers using RRC signaling between the eNB and the UE.

Figure 6:
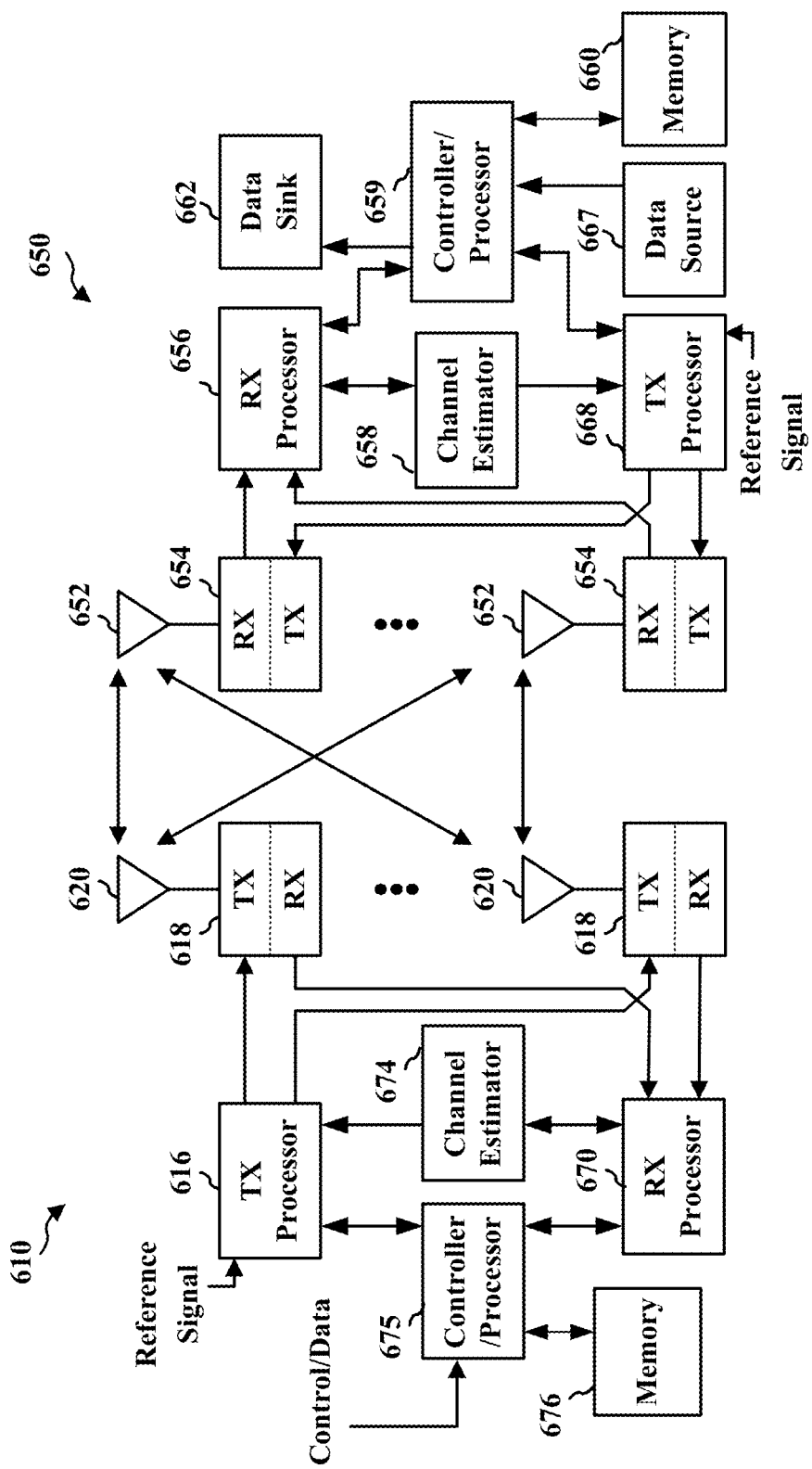
FIG. 6 is a diagram illustrating an example of an evolved Node B and user equipment in an access network.

FIG. 6 is a block diagram of an eNB 610 in communication with a UE 650 in an access network. In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The transmit (TX) processor 616 implements various signal processing functions for the L1 layer (i.e., physical layer). The signal processing functions include coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream may then be provided to a different antenna 620 via a separate transmitter 618TX. Each transmitter 618TX may modulate an RF carrier with a respective spatial stream for transmission.

At the UE 650, each receiver 654RX receives a signal through its respective antenna 652. Each receiver 654RX recovers information modulated onto an RF carrier and provides the information to the receive (RX) processor 656. The RX processor 656 implements various signal processing functions of the L1 layer. The RX processor 656 may perform spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 may be provided to different antenna 652 via separate transmitters 654TX. Each transmitter 654TX may modulate an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the control/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations.

Figure 7:
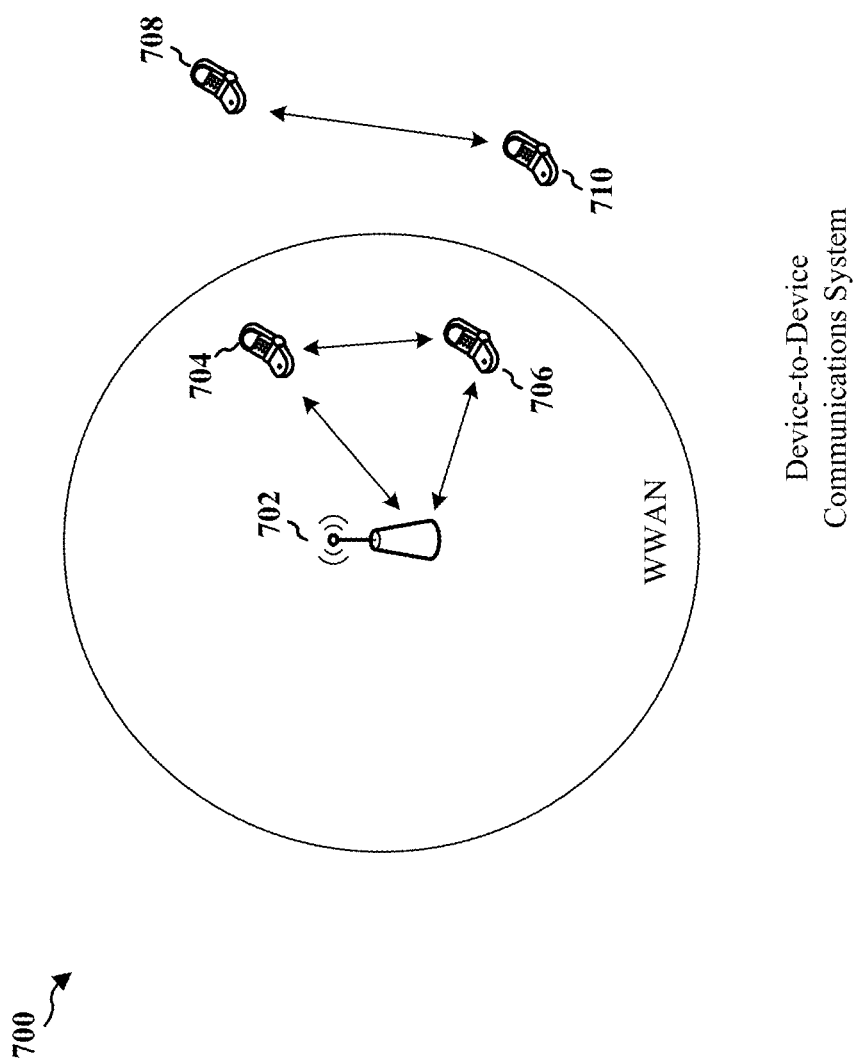
FIG. 7 is a diagram of a device-to-device communications system.

FIG. 7 is a diagram of a device-to-device (also referred to as D2D) communications system 700. The device-to-device communications system 700 includes a plurality of wireless devices 704, 706, 708, 710. The device-to-device communications system 700 may overlap with a cellular communications system, such as for example, a wireless wide area network (WWAN). Some of the wireless devices 704, 706, 708, 710 may communicate together in device-to-device communication using the DL/UL WWAN spectrum, some may communicate with the base station 702, and some may do both. For example, as shown in FIG. 7, the wireless devices 708, 710 are in device-to-device communication and the wireless devices 704, 706 are in device-to-device communication. The wireless devices 704, 706 are also communicating with the base station 702.

The exemplary methods and apparatuses discussed infra are applicable to any of a variety of wireless device-to-device communications systems, such as for example, a wireless device-to-device communication system based on FlashLinQ, WiMedia, Bluetooth, ZigBee, or Wi-Fi based on the IEEE 802.11 standard. To simplify the discussion, the exemplary methods and apparatus are discussed within the context of LTE. However, one of ordinary skill in the art would understand that the exemplary methods and apparatuses are applicable more generally to a variety of other wireless device-to-device communication systems.

In wireless communication systems (e.g., LTE networks), an eNB may allocate resources for use by a pair of UEs engaged in device-to-device communication within the cell covered by the eNB, where the resources are used to establish a device-to-device link between the pair of UEs. However, due to the lack of real-time interference coordination among the eNBs in communication systems, some device-to-device links between UEs in a cell covered by an eNB may receive high and unpredictable interference from transmissions by UEs in adjacent cells (also referred to as neighboring cells). As such, UEs in communication systems that lack real-time interference coordination across cells may experience poor device-to-device link performance.

Figure 8:
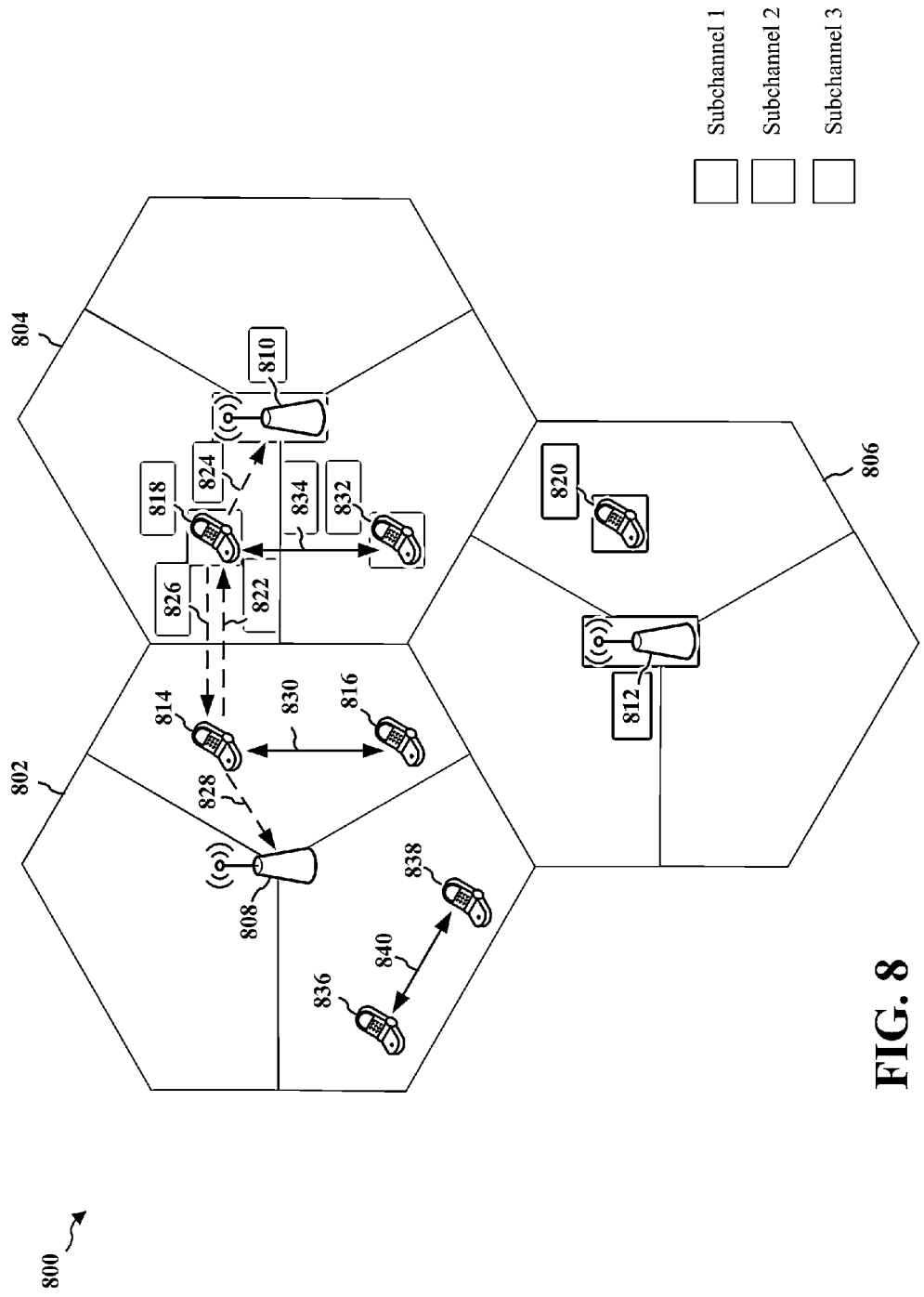
FIG. 8 is a diagram illustrating a communication system in accordance with various aspects of the present disclosure.

FIG. 8 is a diagram illustrating a communication system 800 in accordance with various aspects of the present disclosure. As shown in FIG. 8, communication system 800 includes an eNB 808 (also referred to as base station 808) that provides coverage in cell 802, an eNB 810 that provides coverage in cell 804, and an eNB 812 that provides coverage in cell 806. As further shown in FIG. 8, cell 802 includes UEs 814, 816, 836, and 838, cell 804 includes UEs 818 and 832, and cell 806 includes UE 820. In cell 802, UEs 814 and 816 are in device-to-device communication via link 830, and UEs 836 and 838 are in device-to-device communication via link 840. In an aspect, the wireless resources for link 830 and/or link 840 may be allocated by the eNB 808. For example, the wireless resources for link 830 and/or link 840 may include all or a portion of the WWAN UL spectrum.

In an aspect, each of the eNBs in the communication system 800 may be configured to implement a fractional frequency reuse (FFR) scheme for device-to-device communications by dividing the WWAN UL spectrum into two or more subchannels. For example, each of the subchannels may be a different frequency or a range of different frequencies. In an aspect, the subchannels may be orthogonal with respect to one another. In an aspect, at least one pair of UEs (e.g., pair of UEs 814 and 816) in the communication system 800 may be allocated one or more of the subchannels for device-to-device communication. For example, each pair of UEs in the communication system 800 may use one or more of the subchannels to establish a communication link for device-to-device communication. In one example, with reference to FIG. 8, eNBs 808, 810, and 812, may each divide the entire WWAN UL spectrum into three subchannels, such as subchannel 1, subchannel 2, and subchannel 3. In such example, an eNB (e.g., eNB 808) may allocate any of the subchannels to UEs (e.g., UEs 814, 816, 836, and/or 838) in a cell covered by the eNB for device-to-device communication when such UEs are not interfering with other UEs (e.g., UEs 818, 832, and/or 820) in adjacent cells (e.g., cells 804, 806). It should be understood that in other examples, eNBs 808, 810, and 812, may each divide the entire WWAN UL spectrum into a number of subchannels that is greater or less than three subchannels.

In an aspect, each of the eNBs in the communications system 800 may determine a subset of the subchannels, where the subset of the subchannels are selected by the eNB to reduce interference to UEs in adjacent cells. In an aspect, and as discussed infra, each eNB may determine a subset of the subchannels based on a predetermined pattern. In an aspect, the subchannels in the subset of the subchannels determined by an eNB for a cell may be excluded from the subsets of the subchannels determined by other eNBs for adjacent cells.

For example, eNB 808 may determine a first subset that includes subchannel 1, eNB 810 may determine a second subset that includes subchannel 2, and eNB 812 may determine a third subset that includes subchannel 3. If the eNB 808 determines that UE 814 in the cell 802 is interfering with other UEs (e.g., UEs 818, 832, and/or 820) in adjacent cells (e.g., cells 804, 806), the eNB 808 may allocate subchannel(s) from the first subset (e.g., subchannel 1) to the UE 814 for device-to-device communication. Therefore, in the present example, the UE 814 may be restricted to using subchannel 1 during device-to-device communication with UE 816. In an aspect, if the UE 818 in adjacent cell 804 detects interference caused by transmissions from UE 814 in cell 802, the UE 818 may report the interference to the eNB 810. The eNB 810 may then allocate subchannel 2 and/or subchannel 3 to the UE 818 for device-to-device communication with UE 832. In an aspect, the eNB 810 may perform such allocation by implementing a scheduler that determines a resource to be used by the UE 818 during a period of time. Therefore, since the resources allocated to UE 814 may be restricted to subchannel 1 and since UE 818 may be allocated to subchannels different from subchannel 1 (e.g., subchannel 2 and/or subchannel 3) and/or orthogonal to subchannel 1, interference to UE 818 caused by the transmissions from the UE 814 may be reduced.

In an aspect, if the UE 814 in the cell 802 is not interfering with other UEs (e.g., UEs 818, 832, and/or 820) in adjacent cells (e.g., cells 804, 806), the eNBs in the adjacent cells may allocate any of the subchannel(s) (e.g., subchannel 1, subchannel 2, and/or subchannel 3) to the other UEs (e.g., UEs 818, 832, and/or 820) for device-to-device communication.

In an aspect, an eNB may implement slow scale power control to measurements and reporting to allow for more frequency reuse. For example, a short link (e.g., link 830) between two UEs (e.g., UEs 814 and 816) can use reduced power data transmissions, which can be reflected in the SRS transmit power.

In an aspect, the eNB 808 may determine whether transmissions from the UE 814 in cell 802 are causing interference to UEs in other cells, such as UE 818 in cell 804 and/or UE 820 in cell 806. In one approach, UE 814 may be configured to transmit a signal, such as the signal 822 in FIG. 8, which can be used for measurement and/or interference detection purposes. In an aspect, the eNB 808 may send an instruction to the UE 814 and/or other UEs in the cell 802 to transmit such a signal (e.g., signal 822). For example, the signal 822 may be a sounding reference signal (SRS). In an aspect, SRSs received from out-of-cell transmitters, such as UEs in adjacent cells, may be decoded using sequence/comb/offset selection and may include information for identifying the cell ID associated with the transmitter of the SRS.

In an aspect, the UE 818 in cell 804 may determine whether the strength of the signal 822 exceeds a first threshold. If the strength of the signal 822 exceeds the first threshold, the UE 818 may determine that the signal 822 is causing interference to UE 818 and may send a message 824 to the eNB 810 that identifies the UE 814 as an interfering transmitter. The UE 818 may also compare the strength of the signal 822 to the strength of a device-to-device transmission signal from UE 832 via link 834 and determine whether the difference between the signal strengths is less than a second threshold. If the difference between the signal strengths is less than the second threshold (e.g., 10 dB), the UE 818 may determine that the signal 822 is causing interference to UE 818 and may send the message 824 to the eNB 810 that identifies the UE 814 as an interfering transmitter. In an aspect, the eNB 810 may inform the eNB 808 that the UE 814 is interfering with the UE 818 in neighboring cell 804. For example, the eNB 810 may inform the eNB 808 via an X2 interface (not shown in FIG. 8) between the eNB 808 and eNB 810 or via backhaul signaling.

In another approach, the UE 818 may be configured to transmit a signal, such as the signal 826 in FIG. 8, which can be used for measurement and/or interference detection purposes. In an aspect, the eNB 810 may send an instruction to the UE 818 and/or other UEs in the cell 804 to transmit the signal 826. For example, the signal 826 may be an SRS. The UE 814 in cell 802 may determine whether the strength of the signal 826 exceeds a threshold. If the strength of the signal 826 exceeds the threshold, the UE 814 may determine that transmissions from the UE 814 may be causing interference to the UE 818. In an aspect, the UE 814 may send a message 828 to the eNB 808 that identifies the UE 814 as an interfering transmitter. In an aspect, the signal 826 transmitted by the UE 818 may include information for identifying the cell 804 (also referred to as a cell ID). In such aspect, the UE 814 may decode the signal 826 to determine the cell ID and may include the cell ID in the message 828.

In an aspect, a receiver (e.g., UE 816) in a device-to-device pair (e.g., pair of UEs 814 and 816) may measure one or more subchannels (e.g., subchannel 1, subchannel 2, and/or subchannel 3) to determine an amount of interference that is received on the one or more subchannels. In an aspect, the receiver may measure all subchannels across the entire WWAN UL bandwidth. In an aspect, the receiver may report the measurements (e.g., channel quality information for one or more subchannels) to an eNB (e.g., eNB 808). In such aspect, the eNB 808 may use the reported measurements to determine an amount of power and/or the subchannel(s) that should be allocated to the transmitter (e.g., UE 814) in the device-to-device pair for device-to-device communication.

For example, in the configuration of FIG. 8, if the transmitter (e.g., UE 814) in a device-to-device pair has been determined to be an interfering transmitter, the eNB (e.g., eNB 808) may allocate subchannel 1 to the transmitter regardless of the reported measurements from the receiver (e.g., UE 816). However, if the transmitter (e.g., UE 814) in the device-to-device pair (e.g., pair of UEs 814 and 816) has not been determined to be an interfering transmitter, the eNB (e.g., eNB 808) may allocate one or more of subchannel 1, subchannel 2, and/or subchannel 3 to the transmitter based on the reported measurements from the receiver (e.g., UE 816). In an aspect, the eNB (e.g., eNB 808) may use the reported measurements to allocate one or more of the subchannels that provide reduced interference and/or improved link quality.

Figure 9:
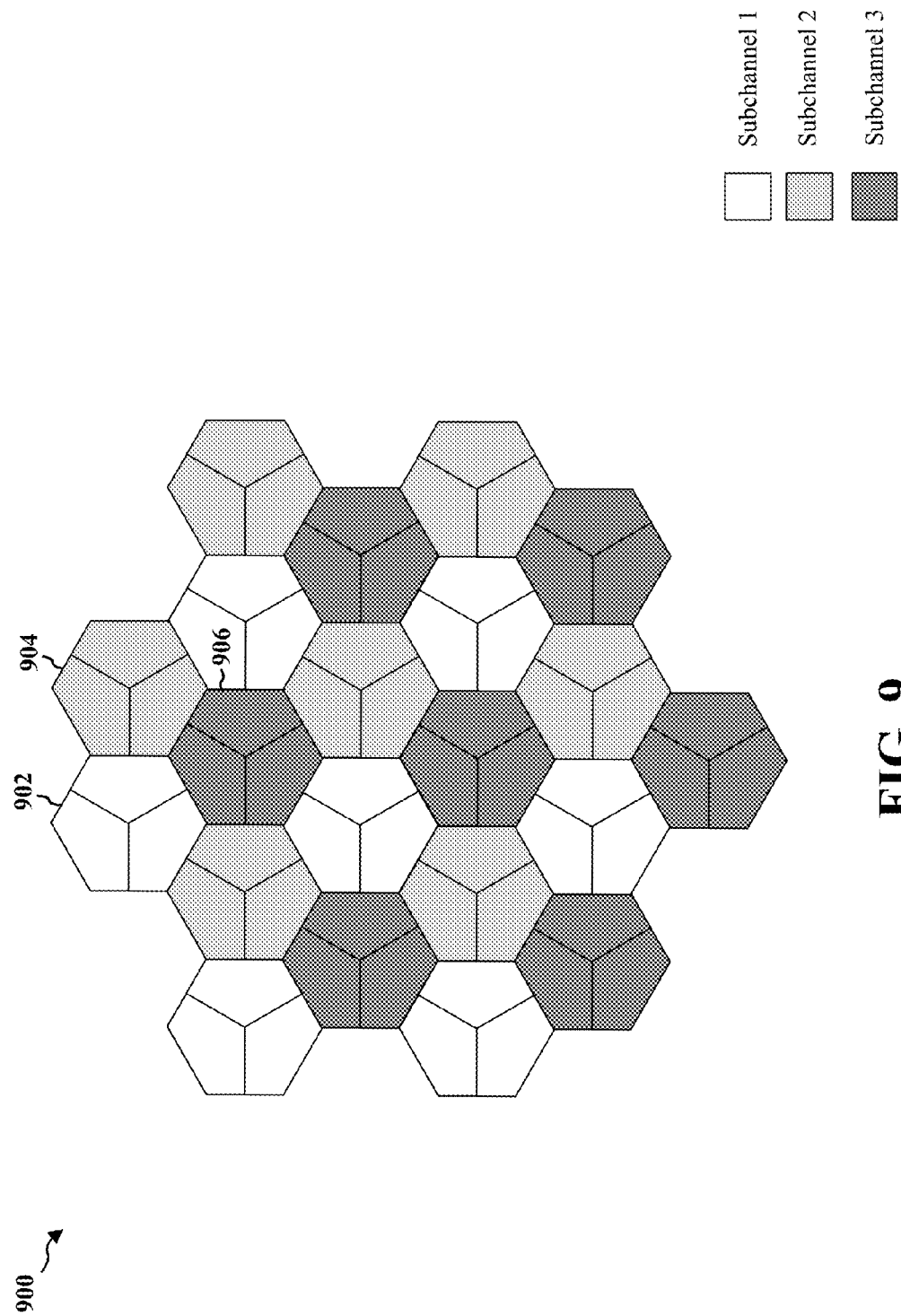
FIG. 9 is a diagram illustrating a communication system in accordance with various aspects of the present disclosure.

FIG. 9 is a diagram 900 illustrating a resource allocation scheme for a communication network in accordance with various aspects of the present disclosure. In FIG. 9, each eNB of a cell (e.g., cell 902, 904, 906) in the communication network may be configured to allocate a subchannel (e.g., subchannel 1, subchannel 2, or subchannel 3) to an interfering transmitter in the cell for device-to-device communication according to a predetermined pattern. For example, eNBs of cells (e.g., cell 902) having no shading may allocate subchannel 1 to an interfering transmitter, eNBs of cells (e.g., cell 904) having light grey shading may allocate subchannel 2 to an interfering transmitter, and eNBs of cells (e.g., cell 906) having dark grey shading may allocate subchannel 3 to an interfering transmitter. In an aspect, the cells 902, 904, and 906 may correspond to cells 802, 804, and 806 previously discussed with respect to FIG. 8. In an aspect, the predetermined pattern of FIG. 9 is configured such that a subchannel (e.g., subchannel 3) for allocation to an interfering transmitter in a cell (e.g., cell 906) is not allocated to other interfering transmitters in adjacent cells (e.g., cell 902 or 904).

Figure 10:
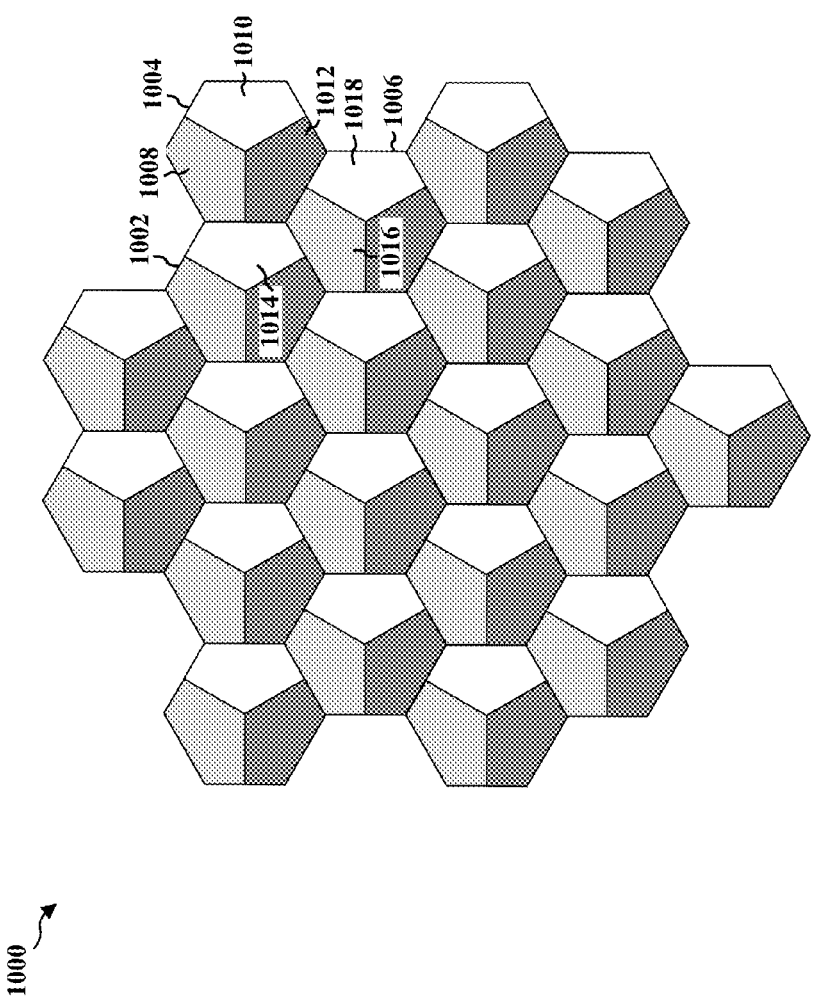
FIG. 10 is a diagram illustrating a communication system in accordance with various aspects of the present disclosure.

FIG. 10 is a diagram 1000 illustrating a resource allocation scheme for a communication network in accordance with various aspects of the present disclosure. In FIG. 10, each eNB of a cell (e.g., cell 1002, 1004, 1006) in the communication network may be configured to allocate a subchannel (e.g., subchannel 1, subchannel 2, or subchannel 3) to an interfering transmitter in a particular sector (e.g., sector 1008, 1010, 1012) of the cell for device-to-device communication according to a predetermined pattern. For example, an eNB of cell 1004 may allocate subchannel 1 to an interfering transmitter in a sector with no shading (e.g., sector 1010), subchannel 2 to an interfering transmitter in a sector with light grey shading (e.g., sector 1008), and subchannel 3 to an interfering transmitter in a sector with dark grey shading (e.g., sector 1012). It should be noted that the predetermined pattern of FIG. 10 is configured such that a subchannel (e.g., subchannel 3) for allocation to an interfering transmitter in a sector of a cell (e.g., sector 1012 of cell 1004) is not allocated to other interfering transmitters in other adjacent sectors (e.g., sector 1014, 1016, 1018).

Figure 11:
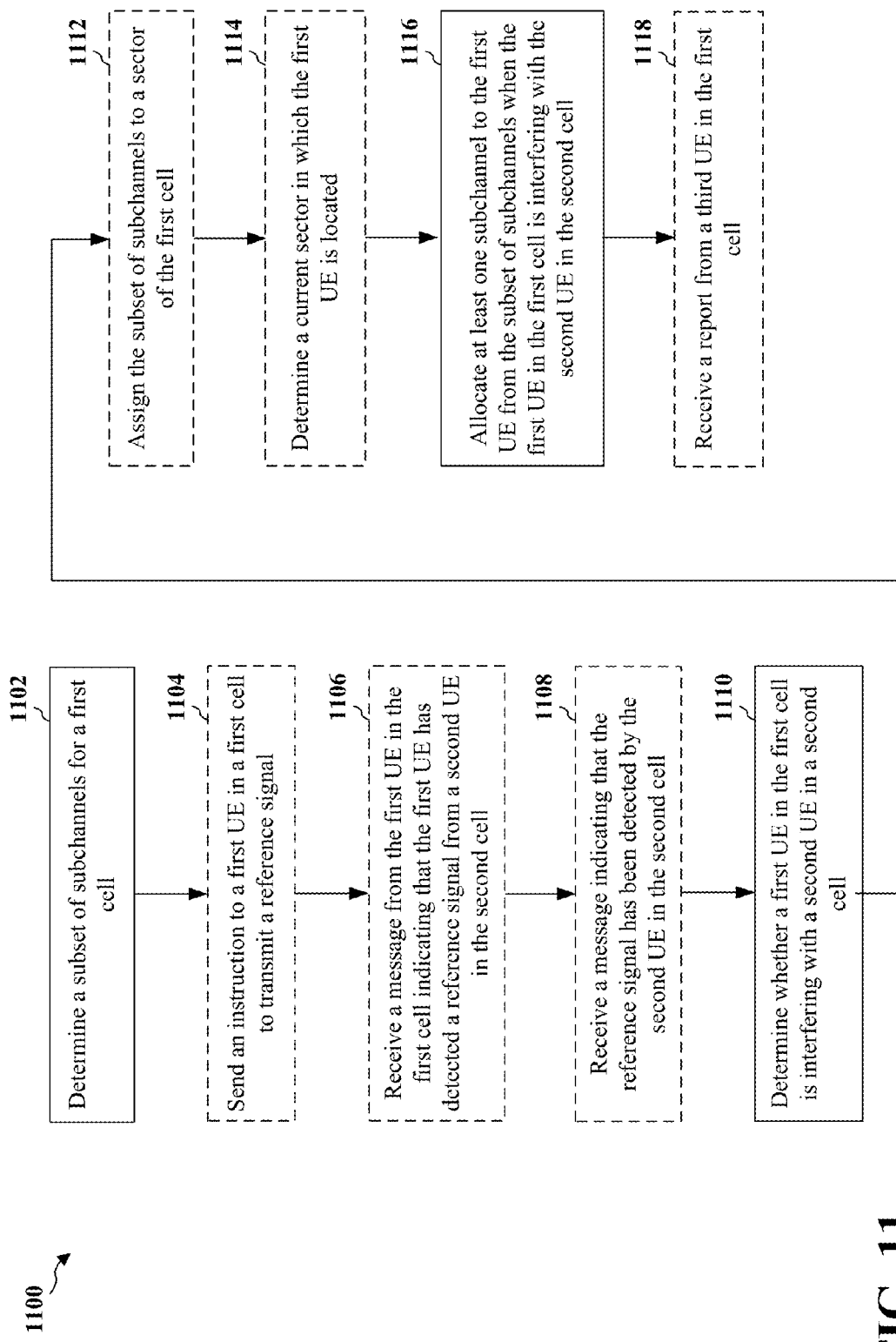
FIG. 11 is a flow chart of a method of wireless communication.

FIG. 11 is a flow chart 1100 of a method of wireless communication. The method may be performed by an eNB, such as the eNB 808 in FIG. 8. It should be understood that the steps (e.g., steps 1104, 1106, 1108, 1112, 1114, and 1118) having dashed lines in FIG. 11 represent optional steps.

At step 1102, the eNB determines a subset of subchannels for a first cell. For example, with reference to FIG. 8, eNB 808 may divide the entire WWAN UL spectrum into three subchannels, such as subchannel 1, subchannel 2, and subchannel 3 and may determine the subset of the subchannels (e.g., subchannel 1) based on a predetermined pattern as described supra with respect to FIGS. 8 and 9. In an aspect, the subset of subchannels may be configured to reduce interference to at least a second UE in a second cell. In an aspect, subchannels in the subset of subchannels for the first cell are excluded from a subset of subchannels for the second cell. In an aspect, all subchannels may be available to the first UE in the first cell when the first UE in the first cell is not interfering with the second UE in the second cell. In an aspect, the second cell is adjacent to the first cell. In an aspect, the first UE is a transmitter in a D2D pair in the first cell and the at least one subchannel is for D2D communications.

At step 1104, the eNB sends an instruction to the first UE to transmit a reference signal. For example, with reference to FIG. 8, the eNB 808 may send an instruction to the UE 814 to transmit signal 822. For example, the signal 822 may be an SRS.

At step 1106, the eNB receives a message from the first UE in the first cell indicating that the first UE has detected a reference signal from the second UE in the second cell. For example, with reference to FIG. 8, the eNB 808 may receive the message 828 from the UE 814 indicating that the UE 814 has detected a reference signal from the UE 818 in cell 804.

At step 1108, the eNB receives a message indicating that the reference signal has been detected by the second UE in the second cell. In an aspect, the message is received from the first UE, the second UE, and/or the second cell. For example, with reference to FIG. 8, the eNB 808 may receive a message from the eNB 810 indicating that the UE 814 is interfering with the UE 818 in neighboring cell 804. For example, the eNB 808 may receive the message from the eNB 810 via an X2 interface (not shown in FIG. 8) between the eNB 808 and eNB 810 or via backhaul signaling.

At step 1110, the eNB determines whether the first UE in the first cell is interfering with the second UE in the second cell. In an aspect, the eNB may determine whether the first UE in the first cell is interfering with the second UE in the second cell based on the received message in step 1106 and/or the received message in step 1108.

At step 1112, the eNB assigns the subset of subchannels to a sector of the first cell. In an aspect, the subset of subchannels may be further configured to reduce interference to at least the second UE in a sector of the second cell that is adjacent to the sector of the first cell. For example, with reference to FIG. 10, an eNB of cell 1004 may assign subchannel 1 to sector 1010, subchannel 2 to sector 1008, and subchannel 3 to sector 1012.

At step 1114, the eNB determines a current sector in which the first UE is located. In an aspect, the allocation is based on the current sector. For example, with reference to FIG. 10, if the eNB of cell 1004 determines that an interfering UE is currently in sector 1010, the eNB may allocate subchannel 1 to the interfering UE.

At step 1116, the eNB allocates at least one subchannel to the first UE from the subset of subchannels when the first UE in the first cell is interfering with the second UE in the second cell. For example, with reference to FIG. 8, the eNB 808 may allocate subchannel 1 to a UE (e.g., UE 814) in cell 802 causing interference to UE 818, where the subchannel 1 is used by the UE (e.g., UE 814) for device-to-device communication with the UE 816.

At step 1118, the eNB receives a report from a third UE in the first cell. In an aspect, the third UE may be a receiver in a D2D pair and the report may include channel quality information for one or more of the available subchannels. In an aspect, the allocation is based on the report. For example, with reference to FIG. 8, a receiver (e.g., UE 816) in a device-to-device pair (e.g., pair of UEs 814 and 816) may measure one or more subchannels (e.g., subchannel 1, subchannel 2, and/or subchannel 3) to determine an amount of interference that is received on the one or more subchannels and may report the measurements (e.g., channel quality information for one or more subchannels) to an eNB (e.g., eNB 808). In such example, the eNB 808 may use the reported measurements to determine an amount of power and/or the subchannel(s) that should be allocated to the transmitter (e.g., UE 814) in the device-to-device pair for device-to-device communication.

Figure 12:
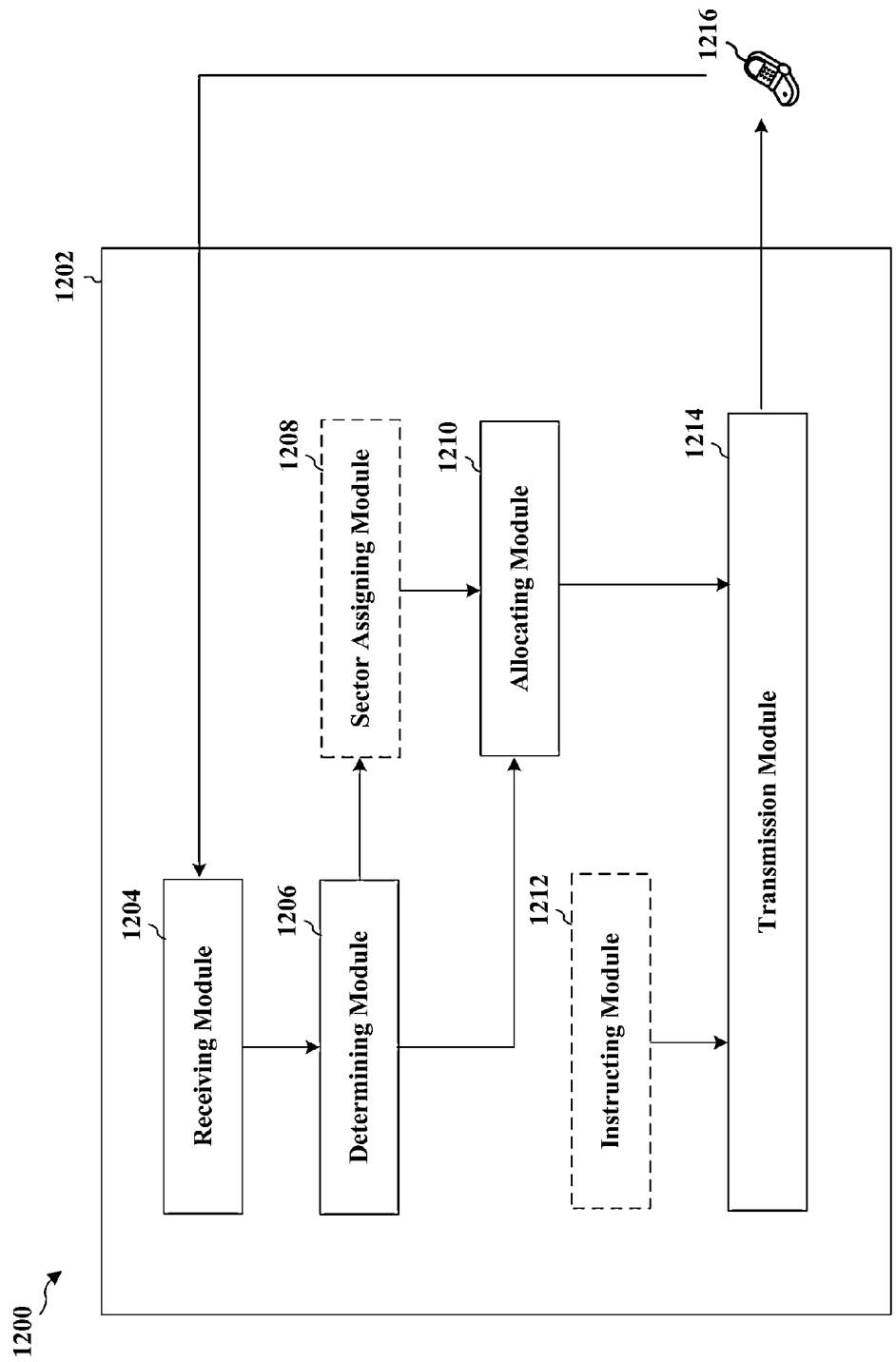
FIG. 12 is a conceptual data flow diagram illustrating the data flow between different modules/means/components in an exemplary apparatus.

FIG. 12 is a conceptual data flow diagram 1200 illustrating the data flow between different modules/means/components in an exemplary apparatus 1202. The apparatus may be an eNB. The apparatus includes a module 1204 that receives a message from the first UE in the first cell indicating that the first UE has detected a reference signal from the second UE in the second cell, receives a message indicating that the reference signal has been detected by the second UE in the second cell, and receives a report from a third UE in the first cell, a module 1206 that determines a subset of subchannels for a first cell, the subset of subchannels configured to reduce interference to at least a second UE in a second cell, determines whether the first UE in the first cell is interfering with the second UE in a second cell, and that determines a current sector in which the first UE is located, a module 1208 that assigns the subset of subchannels to a sector of the first cell, a module 1210 that allocates at least one subchannel to the first UE from the subset of subchannels when the first UE in the first cell is interfering with the second UE in the second cell, a module 1212 that sends an instruction to the first UE to transmit a reference signal, and a module 1214 for transmitting signals to the first UE (e.g., UE 1216) in the first cell.

The apparatus may include additional modules that perform each of the steps of the algorithm in the aforementioned flow chart of FIG. 11. As such, each step in the aforementioned flow chart of FIG. 11 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 13:
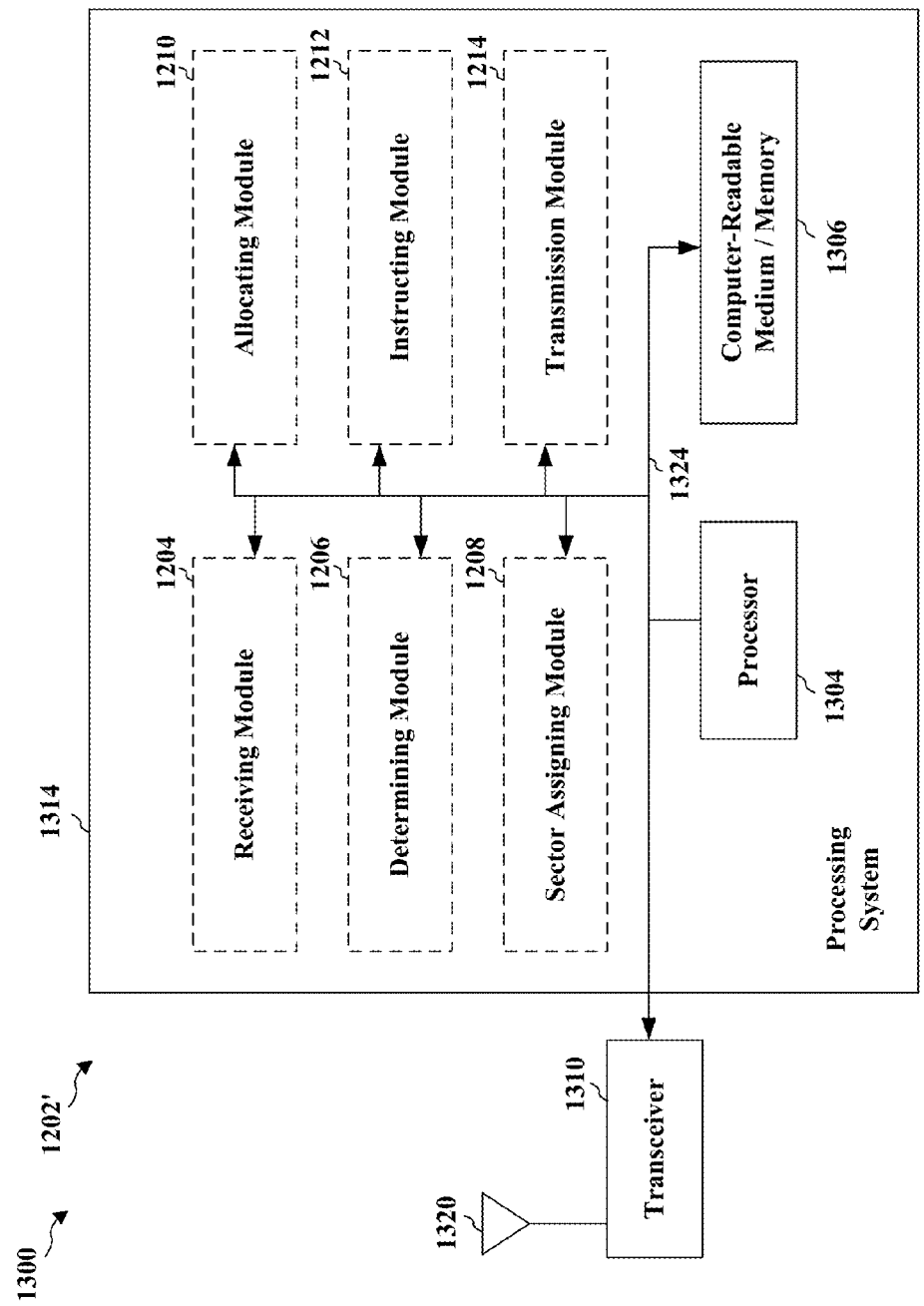
FIG. 13 is a diagram illustrating an example of a hardware implementation for an apparatus employing a processing system.

FIG. 13 is a diagram 1300 illustrating an example of a hardware implementation for an apparatus 1202' employing a processing system 1314. The processing system 1314 may be implemented with a bus architecture, represented generally by the bus 1324. The bus 1324 may include any number of interconnecting buses and bridges depending on the specific application of the processing system 1314 and the overall design constraints. The bus 1324 links together various circuits including one or more processors and/or hardware modules, represented by the processor 1304, the modules 1204, 1206, 1208, 1210, 1212, and 1214, and the computer-readable medium/memory 1306. The bus 1324 may also link various other circuits such as timing sources, peripherals, voltage regulators, and power management circuits, which are well known in the art, and therefore, will not be described any further.

The processing system 1314 may be coupled to a transceiver 1310. The transceiver 1310 is coupled to one or more antennas 1320. The transceiver 1310 provides a means for communicating with various other apparatus over a transmission medium. The transceiver 1310 receives a signal from the one or more antennas 1320, extracts information from the received signal, and provides the extracted information to the processing system 1314, specifically the receiving module 1204. In addition, the transceiver 1310 receives information from the processing system 1314, specifically the transmission module 1214, and based on the received information, generates a signal to be applied to the one or more antennas 1320. The processing system 1314 includes a processor 1304 coupled to a computer-readable medium/memory 1306. The processor 1304 is responsible for general processing, including the execution of software stored on the computer-readable medium/memory 1306. The software, when executed by the processor 1304, causes the processing system 1314 to perform the various functions described supra for any particular apparatus. The computer-readable medium/memory 1306 may also be used for storing data that is manipulated by the processor 1304 when executing software. The processing system further includes at least one of the modules 1204, 1206, 1208, 1210, 1212, and 1214. The modules may be software modules running in the processor 1304, resident/stored in the computer readable medium/memory 1306, one or more hardware modules coupled to the processor 1304, or some combination thereof. The processing system 1314 may be a component of the eNB 610 and may include the memory 676 and/or at least one of the TX processor 616, the RX processor 670, and the controller/processor 675.

In one configuration, the apparatus 1202/1202' for wireless communication includes means for determining a subset of subchannels for a first cell, the subset of subchannels configured to reduce interference to at least a second UE in a second cell, means for determining whether the first UE in the first cell is interfering with the second UE in a second cell, means for allocating at least one subchannel to the first UE from the subset of subchannels when the first UE in the first cell is interfering with the second UE in the second cell, means for assigning the subset of subchannels to a sector of the first cell, means for determining a current sector in which the first UE is located, means for receiving a message from the first UE in the first cell indicating that the first UE has detected a reference signal from the second UE in the second cell, wherein the determination is based on the message, means for sending an instruction to the first UE to transmit a reference signal, means for receiving a message indicating that the reference signal has been detected by the second UE in the second cell, and means for receiving a report from a third UE in the first cell. The aforementioned means may be one or more of the aforementioned modules of the apparatus 1202 and/or the processing system 1314 of the apparatus 1202' configured to perform the functions recited by the aforementioned means. As described supra, the processing system 1314 may include the TX Processor 616, the RX Processor 670, and the controller/processor 675. As such, in one configuration, the aforementioned means may be the TX Processor 616, the RX Processor 670, and the controller/processor 675 configured to perform the functions recited by the aforementioned means.

Figure 14:
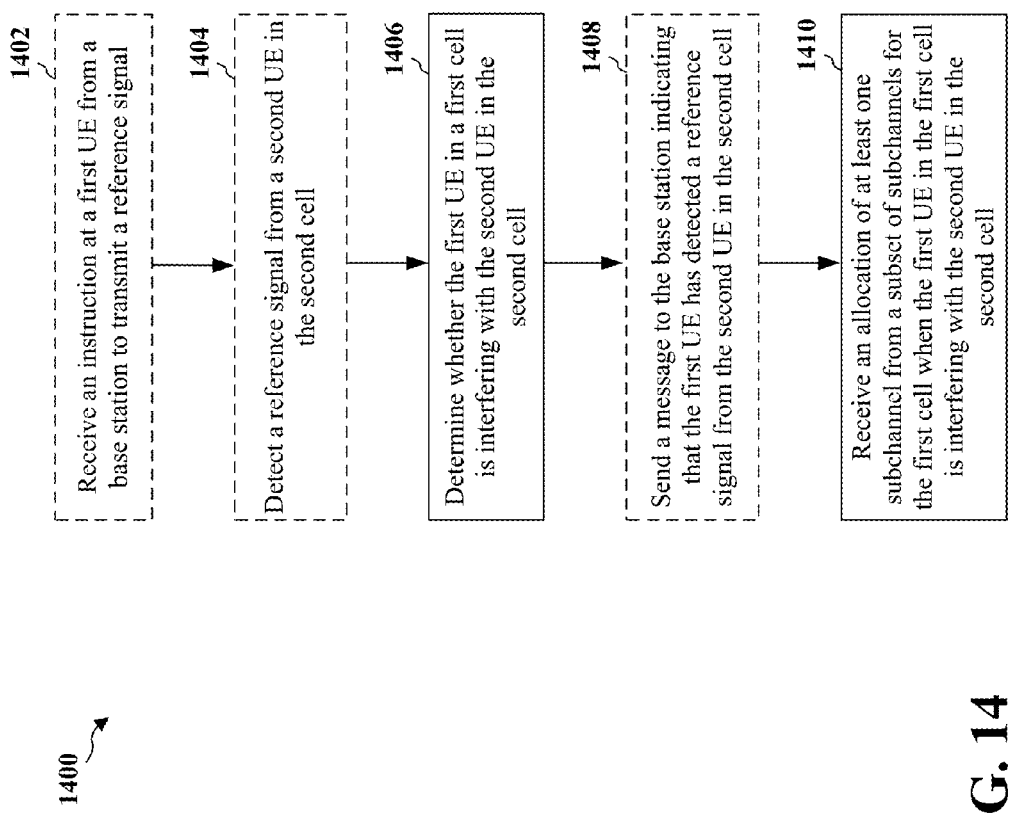
FIG. 14 is a flow chart of a method of wireless communication.

FIG. 14 is a flow chart 1400 of a method of wireless communication. The method may be performed by a first UE, such as the first UE 814 in FIG. 8. It should be understood that the steps (e.g., steps 1402, 1404, and 1408) having dashed lines in FIG. 14 represent optional steps. At step 1402, the first UE receives an instruction from a base station to transmit a reference signal.

At step 1404, the first UE detects a reference signal from the second UE in the second cell. In an aspect, the second cell is adjacent to the first cell. For example, with reference to FIG. 8, the UE 814 may detect a signal 826 transmitted from UE 818, where the signal 826 may be a reference signal (e.g., SRS) which can be used for measurement and/or interference detection purposes.

At step 1406, the first UE determines whether the first UE in a first cell is interfering with a second UE in a second cell. In an aspect, the determination is based on the detected reference signal. For example, with reference to FIG. 8, the UE 814 in cell 802 may determine whether the strength of the detected signal 826 exceeds a threshold. If the strength of the signal 826 exceeds the threshold, the UE 814 may determine that transmissions from the UE 814 may be causing interference to the UE 818.

At step 1408, the first UE sends a message to a base station indicating that the first UE has detected a reference signal from the second UE in the second cell. For example, with reference to FIG. 8, the UE 814 may send a message 828 to the eNB 808 that identifies the UE 814 as an interfering transmitter.

At step 1410, the first UE receives an allocation of at least one subchannel from a subset of subchannels for the first cell when the first UE in the first cell is interfering with the second UE in the second cell. In an aspect, the first UE is a transmitter in a D2D pair in the first cell and the at least one subchannel is for D2D communications. In an aspect, the subset of subchannels is configured to reduce interference to at least the second UE in the second cell. In an aspect, subchannels in the subset of subchannels for the first cell are excluded from a subset of subchannels for the second cell. In an aspect, the subset of subchannels are assigned to a sector of the first cell, where the subset of subchannels are configured to reduce interference to at least the second UE in a sector of the second cell that is adjacent to the sector of the first cell. In an aspect, the allocation is based on a current sector of the first UE. In an aspect, all subchannels are available to the first UE in the first cell when the first UE in the first cell is not interfering with the second UE in the second cell.

Figure 15:
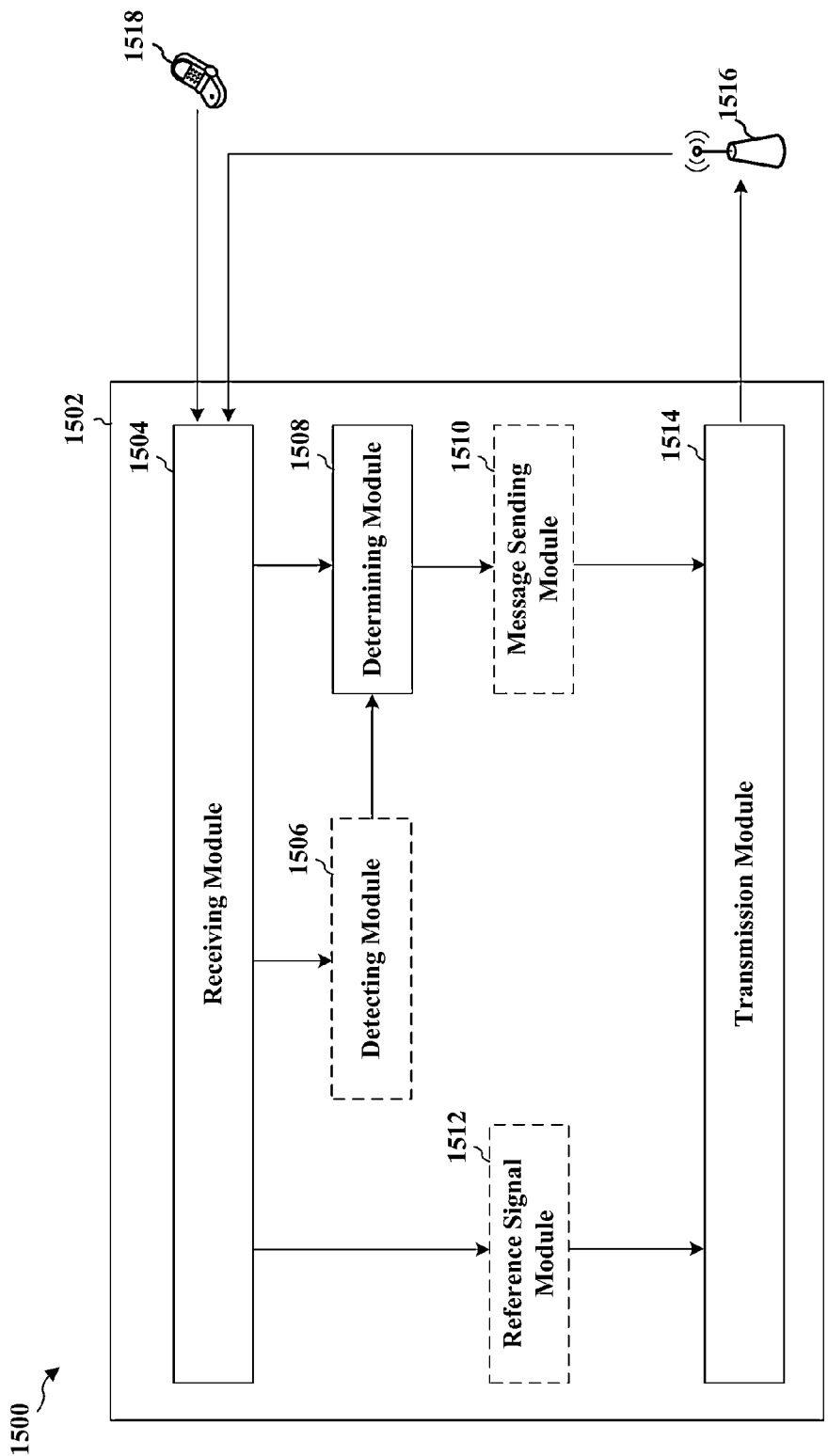
FIG. 15 is a conceptual data flow diagram illustrating the data flow between different modules/means/components in an exemplary apparatus.

FIG. 15 is a conceptual data flow diagram 1500 illustrating the data flow between different modules/means/components in an exemplary apparatus 1502. The apparatus may be a UE (e.g., first UE 814). The apparatus includes a module 1504 that receives an instruction from a base station (e.g., eNB 1516) to transmit a reference signal and receives an allocation of at least one subchannel from a subset of subchannels for the first cell when the first UE in the first cell is interfering with the second UE (e.g., UE 1518) in the second cell, the subset of subchannels being configured to reduce interference to at least the second UE in the second cell, a module 1506 that detects a reference signal from the second UE in the second cell, a module 1508 that determines whether the first UE in a first cell is interfering with a second UE in a second cell, and a module 1510 that sends a message to a base station indicating that the first UE has detected a reference signal from the second UE in the second cell.

The apparatus may include additional modules that perform each of the steps of the algorithm in the aforementioned flow chart of FIG. 14. As such, each step in the aforementioned flow chart of FIG. 14 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 16:
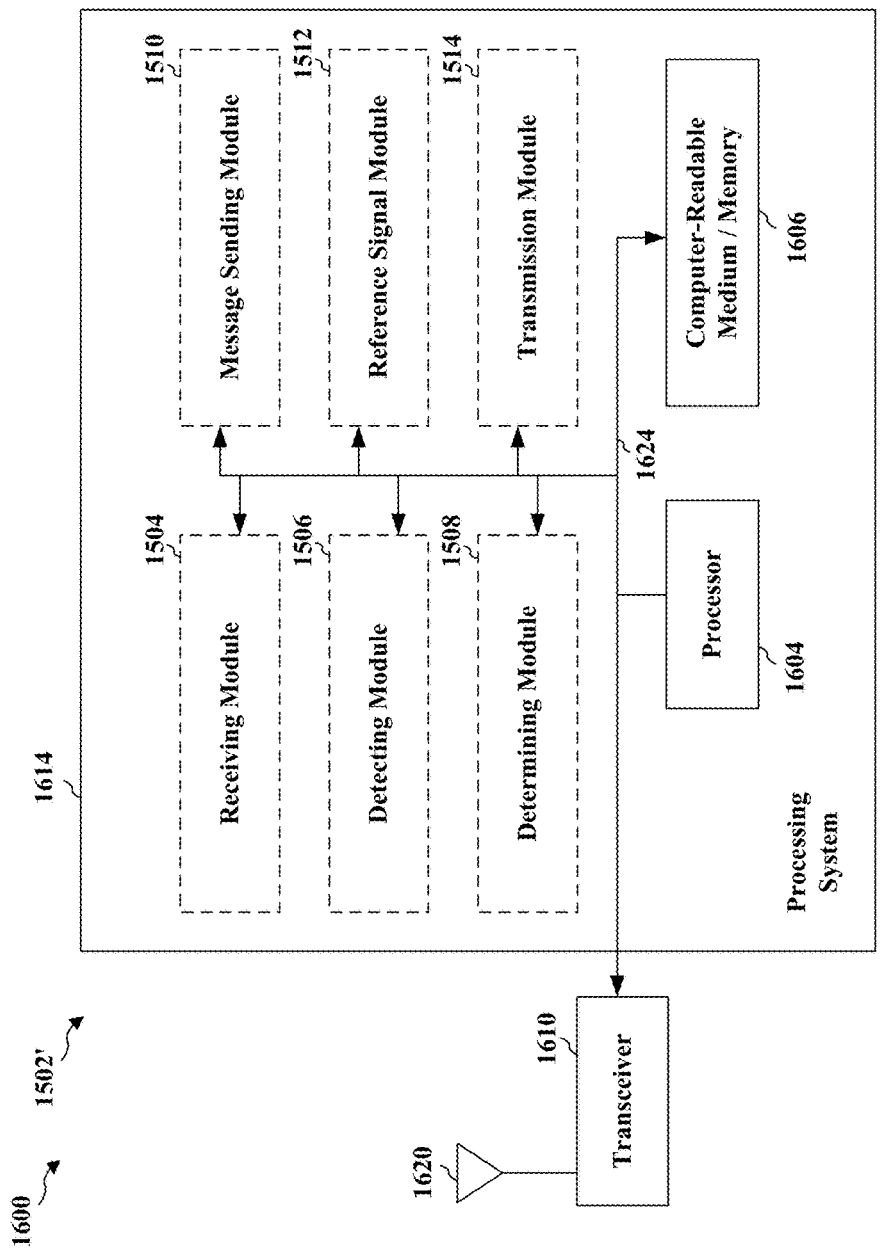
FIG. 16 is a diagram illustrating an example of a hardware implementation for an apparatus employing a processing system.

FIG. 16 is a diagram 1600 illustrating an example of a hardware implementation for an apparatus 1502' employing a processing system 1614. The processing system 1614 may be implemented with a bus architecture, represented generally by the bus 1624. The bus 1624 may include any number of interconnecting buses and bridges depending on the specific application of the processing system 1614 and the overall design constraints. The bus 1624 links together various circuits including one or more processors and/or hardware modules, represented by the processor 1604, the modules 1504, 1506, 1508, 1510, 1512, and 1514, and the computer-readable medium/memory 1606. The bus 1624 may also link various other circuits such as timing sources, peripherals, voltage regulators, and power management circuits, which are well known in the art, and therefore, will not be described any further.

The processing system 1614 may be coupled to a transceiver 1610. The transceiver 1610 is coupled to one or more antennas 1620. The transceiver 1610 provides a means for communicating with various other apparatus over a transmission medium. The transceiver 1610 receives a signal from the one or more antennas 1620, extracts information from the received signal, and provides the extracted information to the processing system 1614, specifically the receiving module 1504. In addition, the transceiver 1610 receives information from the processing system 1614, specifically the transmission module 1514, and based on the received information, generates a signal to be applied to the one or more antennas 1620. The processing system 1614 includes a processor 1604 coupled to a computer-readable medium/memory 1606. The processor 1604 is responsible for general processing, including the execution of software stored on the computer-readable medium/memory 1606. The software, when executed by the processor 1604, causes the processing system 1614 to perform the various functions described supra for any particular apparatus. The computer-readable medium/memory 1606 may also be used for storing data that is manipulated by the processor 1604 when executing software. The processing system further includes at least one of the modules 1504, 1506, 1508, 1510, 1512, and 1514. The modules may be software modules running in the processor 1604, resident/stored in the computer readable medium/memory 1606, one or more hardware modules coupled to the processor 1604, or some combination thereof. The processing system 1614 may be a component of the UE 650 and may include the memory 660 and/or at least one of the TX processor 668, the RX processor 656, and the controller/processor 659.

In one configuration, the apparatus 1502/1502' for wireless communication includes means for receiving an instruction from a base station to transmit a reference signal, means for detecting a reference signal from the second UE in the second cell, wherein the determination is based on the detected reference signal, means for determining whether the first UE in a first cell is interfering with a second UE in a second cell, means for sending a message to a base station indicating that the first UE has detected a reference signal from the second UE in the second cell, and means for receiving an allocation of at least one subchannel from a subset of subchannels for the first cell when the first UE in the first cell is interfering with the second UE in the second cell, the subset of subchannels being configured to reduce interference to at least the second UE in the second cell. The aforementioned means may be one or more of the aforementioned modules of the apparatus 1502 and/or the processing system 1614 of the apparatus 1502' configured to perform the functions recited by the aforementioned means. As described supra, the processing system 1614 may include the TX Processor 668, the RX Processor 656, and the controller/processor 659. As such, in one configuration, the aforementioned means may be the TX Processor 668, the RX Processor 656, and the controller/processor 659 configured to perform the functions recited by the aforementioned means.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:
1. A method of wireless communication, comprising:
  determining a subset of subchannels for a first cell, the subset of subchannels configured to reduce interference from at least a first user equipment (UE) in the first cell to at least a second UE in a second cell;
  determining whether the first UE in the first cell is interfering with the second UE in the second cell based at least on a message received from the first UE indicating that the first UE in the first cell is causing interference to the second UE in the second cell, the second UE being in device-to-device (D2D) communication with a third UE; and allocating at least one subchannel to the first UE from the subset of subchannels when the first UE in the first cell is interfering with the second UE in the second cell.

2. The method of claim 1, wherein subchannels in the subset of subchannels for the first cell are excluded from a subset of subchannels for the second cell.

3. The method of claim 1, further comprising assigning the subset of subchannels to a sector of the first cell, the subset of subchannels further configured to reduce interference to at least the second UE in a sector of the second cell that is adjacent to the sector of the first cell.

4. The method of claim 3, further comprising determining a current sector in which the first UE is located, wherein the allocation is based on the current sector.

5. The method of claim 1, wherein all subchannels are available to the first UE in the first cell when the first UE in the first cell is not interfering with the second UE in the second cell.

6. The method of claim 1, wherein the message from the first UE in the first cell further indicates that the first UE has detected a reference signal from the second UE in the second cell.

7. The method of claim 1, wherein the second cell is adjacent to the first cell.

8. The method of claim 1, wherein the first UE is a transmitter in a device-to-device (D2D) pair in the first cell and the at least one subchannel is for D2D communications.

9. A method of wireless communication, comprising:
determining a subset of subchannels for a first cell, the subset of subchannels configured to reduce interference from at least a first user equipment (UE) in the first cell to at least a second UE in a second cell;
sending an instruction to the first UE to transmit a reference signal; and
receiving a message indicating that the reference signal has been detected by the second UE in the second cell;
determining whether the first UE in the first cell is interfering with the second UE in the second cell based at least on the message, the message being received from at least one of the first UE, the second UE, or the second cell; and
allocating at least one subchannel to the first UE from the subset of subchannels when the first UE in the first cell is interfering with the second UE in the second cell.

10. A method of wireless communication, comprising:
determining a subset of subchannels for a first cell, the subset of subchannels configured to reduce interference from at least a first user equipment (UE) in the first cell to at least a second UE in a second cell;
determining whether the first UE in the first cell is interfering with the second UE in the second cell based at least on a message, the message being received from at least one of the first UE, the second UE, or the second cell; and
allocating at least one subchannel to the first UE from the subset of subchannels when the first UE in the first cell is interfering with the second UE in the second cell;
wherein the first UE is a transmitter in a device-to-device (D2D) pair in the first cell and the at least one subchannel is for D2D communications; and
wherein the method further comprises receiving a report from a third UE in the first cell, the third UE being a receiver in the D2D pair, wherein the report comprises channel quality information for one or more of the subchannels and wherein the allocation is based on the report.

11. A method of wireless communication of a first user equipment (UE), comprising:
determining whether the first UE in a first cell is interfering with a second UE in a second cell based on a reference signal from the second UE;
sending a message to the first cell indicating that the first UE has detected the reference signal from the second UE in the second cell and indicating that first UE is causing interference to the second UE in the second cell; and
receiving an allocation of at least one subchannel from a subset of subchannels for the first cell when the first UE in the first cell is interfering with the second UE in the second cell, the subset of subchannels being configured to reduce interference from the first UE in the first cell to at least the second UE in the second cell.

12. The method of claim 11, wherein subchannels in the subset of subchannels for the first cell are excluded from a subset of subchannels for the second cell.

13. The method of claim 11, wherein the subset of subchannels are assigned to a sector of the first cell, the subset of subchannels further configured to reduce interference to at least the second UE in a sector of the second cell that is adjacent to the sector of the first cell.

14. The method of claim 13, wherein the allocation is based on a current sector of the first UE.

15. The method of claim 11, wherein all subchannels are available to the first UE in the first cell when the first UE in the first cell is not interfering with the second UE in the second cell.

16. The method of claim 11, further comprising detecting the reference signal from the second UE in the second cell.

17. The method of claim 11, further comprising receiving an instruction from a base station to transmit a reference signal.

18. The method of claim 11, wherein the second cell is adjacent to the first cell.

19. The method of claim 11, wherein the first UE is a transmitter in a device-to-device (D2D) pair in the first cell and the at least one subchannel is for D2D communications.

20. An apparatus for wireless communication, comprising:
means for determining a subset of subchannels for a first cell, the subset of subchannels configured to reduce interference from at least a first user equipment (UE) in the first cell to at least a second UE in a second cell;
means for determining whether the first UE in the first cell is interfering with the second UE in the second cell based at least on a message received from the first UE indicating that the first UE in the first cell is causing interference to the second UE in the second cell, the second UE being in device-to-device (D2D) communication with a third UE; and
means for allocating at least one subchannel to the first UE from the subset of subchannels when the first UE in the first cell is interfering with the second UE in the second cell.

21. The apparatus of claim 20, further comprising means for assigning the subset of subchannels to a sector of the first cell, the subset of subchannels further configured to reduce interference to at least the second UE in a sector of the second cell that is adjacent to the sector of the first cell.

22. The apparatus of claim 21, further comprising means for determining a current sector in which the first UE is located, wherein the allocation is based on the current sector.

23. The apparatus of claim 20, further comprising means for receiving the message from the first UE in the first cell, the message further indicating that the first UE has detected a reference signal from the second UE in the second cell, wherein the determination is based on the message.

24. An apparatus for wireless communication, comprising:
   means for determining a subset of subchannels for a first cell, the subset of subchannels configured to reduce interference from at least a first user equipment (UE) in the first cell to at least a second UE in a second cell;
   means for sending an instruction to the first UE to transmit a reference signal; and
   means for receiving a message indicating that the reference signal has been detected by the second UE in the second cell,
   means for determining whether the first UE in the first cell is interfering with the second UE in the second cell based at least on the message, the message being received from at least one of the first UE, the second UE, or the second cell; and
   means for allocating at least one subchannel to the first UE from the subset of subchannels when the first UE in the first cell is interfering with the second UE in the second cell.

25. An apparatus for wireless communication, comprising:
   means for determining whether a first user equipment (UE) in a first cell is interfering with a second UE in a second cell based on a reference signal from the second UE;
   means for sending a message to the first cell indicating that the first UE has detected a reference signal from the second UE in the second cell and indicating that first UE is causing interference to the second UE in the second cell; and
   means for receiving an allocation of at least one subchannel from a subset of subchannels for the first cell when the first UE in the first cell is interfering with the second UE in the second cell, the subset of subchannels being configured to reduce interference from the first UE in the first cell to at least the second UE in the second cell.

26. The apparatus of claim 25, wherein subchannels in the subset of subchannels for the first cell are excluded from a subset of subchannels for the second cell.

27. The apparatus of claim 25, further comprising means for detecting the reference signal from the second UE in the second cell.

* * * * *